United States Patent [19]
Iga

[11] Patent Number: 5,194,832
[45] Date of Patent: Mar. 16, 1993

[54] TRANSVERSAL EQUALIZER

[75] Inventor: Hiroyuki Iga, Yokohama, Japan

[73] Assignee: Kabushiki Kaisha Toshiba, Kawasaki, Japan

[21] Appl. No.: 745,712

[22] Filed: Aug. 16, 1991

[30] Foreign Application Priority Data

Aug. 17, 1990 [JP] Japan .................................. 2-216643

[51] Int. Cl.$^5$ ......................... H03G 11/04; H04B 3/04
[52] U.S. Cl. .................................. 333/18; 333/28 R; 375/13; 364/724
[58] Field of Search .......................... 333/18, 28 R, 166; 375/12, 13, 14; 364/724, 825

[56] References Cited

U.S. PATENT DOCUMENTS 4,359,778 11/1982 Lee ......................................... 375/13
4,483,009 11/1984 Honda et al. ...................... 333/18 X

OTHER PUBLICATIONS

Patent Abstracts of Japan, vol. 14, No. 414 (E-975) 7 Sep. 1990.
Patent Abstracts of Japan, vol. 13, No. 2 (E-700) 6 Jan. 1989.
Patent Abstracts of Japan, vol. 5, No. 23 (E-45) 12 Feb. 1981.
Goyal et al., Performance Evaluations of Selected Automatic Deghosting Systems for Television, IEEE Transactions on Consumer Electronics, vol. CE-26, Feb. 1980.
R. Takayama et al., Ghost Cancel Reference Signal Method, National Convention Record of the Institute of Television Engineers of Japan, 1989, 11-1, pp. 239-240.
Iga et al., Ghost Clean System, ITEJ Technical Report, Oct. 1989, Vo. 13, No. 53, pp. 7-12, CE'89-9.

Primary Examiner—Paul M. Dzierzynski
Assistant Examiner—Ali Neyzari
Attorney, Agent, or Firm—Cushman, Darby & Cushman

[57] ABSTRACT

A transversal equalizer having a specified number of rear taps. The transversal equalizer includes a first transversal equalizer unit which receives input signals through a first input terminal, equalizes their waveforms, and outputs the equalized signals as cascaded signals and a second transversal equalizer unit which receives the cascade output signals and also receives input signals and outputs an equalized signal derived from the input signals.

3 Claims, 5 Drawing Sheets

TRANSVERSAL EQUALIZER

FIELD OF THE INVENTION

The present invention relates generally to a transversal equalizer, and more particularly, to a transversal equalizer for a real-time filter processing on input signals.

BACKGROUND OF THE INVENTION

In recent years, a GCR (ghost cancel reference) signal has been adopted in a TV broadcasting signal. The GCR signal is placed in the vertical retrace line period of the TV signal to be referenced for deghosting operation in TV receivers. Such a TV receiver uses a transversal equalizer for performing the deghosting operation in reference to the received GCR signal.

Shown in FIG. 1 is a typical construction of such a transversal equalizer. Such a transversal equalizer shown in FIG. 1 is discussed in, for example, Shri Goyal et al., "Performance Evaluations of Selected Automatic Deghosting Systems for Television", "IEEE Transactions on Consumer Electronics", Vol. CE-26, pp. 100–120 (February 1980) and is called a 6-taps transversal equalizer.

In FIG. 1, an input signal is sampled at every T second and this input sample value Xi is applied to the input terminal 1. This input sample value Xi is applied to the multipliers M1 through M6, respectively and multiplied by coefficients (hereinafter called as tap coefficient) C1 through C6.

Outputs of the multipliers M1 through M6 are applied to the adders A1 through A6, respectively. Outputs from the adders A1 through A6 are delayed by the delay units D1 through D6, respectively and applied to the output terminal 2 and the adders A1 through A5 in the next filter stage.

Further, the delay units D1 through D6 are driven by the clock CK in T seconds period supplied through the input terminal 3 and output input signals by delaying by T seconds. At the output terminal 2, an output based on a tap coefficient appears and it is possible to equalize the transmission lines by setting the tap coefficient.

Further, signals from the preceding stage are input to the cascade input terminal 4. This signal is added to the output from the multiplier M6 in the adder A6.

Now, assuming that an input sample value Xi is $\delta$ function $\{\delta i\}$, its impulse response $\{\alpha i\}$ is $\alpha 1 = C1$, $\alpha 2 = C2, \ldots, \alpha 6 = C6$. As the length of a train of impulse responses is the same as the number of taps, a longer train of impulse responses is obtainable by increasing the number of taps. That is, a filtering time can be extended by increasing the number of taps.

The range of delay times in which ghost can be cancelled by GCR signal is 44.7 $\mu$s of GCR signal width. See, for example, Susumu Takayama et al., "System of Ghost Cancel Reference Signal", "1989 National Convention Record of the Institute of Television Engineers of Japan", pp. 239–240.

As described above, the length of the filtering time is decided by the number of taps and the number of taps required to obtain the range of 44.7 $\mu$s delay time is expressed by 44.7 $\mu$s/T (clock period). Normally, the clock frequency in the TV signal digital processing is set at 4 times the color subcarrier frequency (14.31818 MHz) and the clock period T is 69.84 $\mu$s. That is, in the de-ghosting using GCR signal, as many as 640 taps are needed.

Transversal equalizers have normally been made in integrated circuits (IC) and with the advanced degree of integration, 64 taps have been integrated in a single chip like TF-IC adopted in Toshiba's ghost clean TV tuner (TT-GC9).

Shown in FIG. 2 is a block diagram showing a conventional transversal equalizer which has adopted such transversal equalizers. See, for example, "Ghost Image Reducing Tuner and its Operation", Japanese magazine "Chroma", pp. 48–51, (December 1989).

A video signal subjected to disturbance by a ghost image is input to the input terminal 5. In this input video signal the GCR signal has been inserted.

The input video signal is input to the input terminal 6 of the transversal equalizer. The cascade input terminal 7 of the transversal filter 11 is connected to the reference potential point. Further, the input terminals 6 and 7 correspond to the input terminals 1 and 4 shown in FIG. 1.

To respective taps of 64 multipliers of the transversal filter 11, not shown, tap coefficients C-29 and C34 are applied, respectively. Further, subscripts of the tap coefficients indicate which delay time of clock period T they correspond to.

The coefficient of the main tap corresponding to the rising edge of the GCR signal is C0 and 1 is set for C0 and 0 for other tap coefficients at the time of initialization. Therefore, in the state of initialization, the transversal filter 11 directly outputs the video signal input to the input terminal 6 from the output terminal 8.

This transversal filter 11 is of the non-recursive type and cancel the ghosts existing between $-2$ $\mu$s (pre-ghost) and 2.4 $\mu$s (delayed-ghost) by the tap coefficients C-29 through C34. That is, cancellation of waveform distortion (waveform equalization) and cancellation of ghost in short delay times (nearby-ghost) are performed by the transversal filter 11.

Output from the transversal filter 11 is applied to the output terminal 10 through the subtractor 9 and at the same time, to the delay unit 21 from the output terminal 10.

Output of the delay unit 21 is applied to the input terminal 6 of each of the transversal filters 12 through 20 in the same construction as the transversal filter 11. The number of taps of the transversal filters 12 through 20 is 64 and tap coefficients C35 through C610 are applied to the transversal filters 12 through 20. That is, the transversal filters 12 through 20 correspond to delayed ghosts existing between 2.4 $\mu$s and 42.6 $\mu$s.

Outputs of the transversal equalizers 20 through 12 are applied to each cascade input terminal 7 and the subtractor 9 of the transversal filters 19 through 12 in the next stage from respective output terminals 8, thus forming the recursive filter.

The coefficients C35 through C610 are set at 0 in the initial state and when tap coefficients are corrected thereafter, a ghost cancelling signal is output from the transversal equalizer 12. The subtractor 9 outputs a deghosted video signal to the output terminal 10 after subtracting the ghost cancelling signal from the output of the transversal filter 11.

Tap coefficients C-29 through C610 are obtained through operation of the GCR signal extracted from input/output video signals and reference signal and are successively corrected at specified time intervals. That is, the GCR signal contained in video signal from the input terminal 5 and GCR signal contained in the video signal from the output terminal 10 are extracted, the GCR signal contained in the output video signal is compared with a reference signal to get an error signal and further, correlated operation of this error signal with GCR signal contained in the input video signal is carried out and tap coefficients are corrected to minimize the error signal.

Further, as described above, the same ICs are used for the transversal filters 11 through 20 from the viewpoint of cost.

As described above, waveform equalization and nearby-ghost image removal are performed by the non-recursive transversal filter 11 and long delayed ghost and secondary ghost (see the above-mentioned magazine, "Chroma") produced by this transversal filter 11 are removed by the recursive transversal filters 12 through 20.

Series connection of the non-recursive and recursive transversal filters is the construction best suited for removal of ghost image as shown in the above-mentioned "Chroma".

Generally, as to pre-ghost images, if pre-ghost images of delay time less than 2 μs are removed, there will be no problem in practical use. On the other hand, the delay time of delayed ghost image may sometimes become more than 40 μs.

Since the range of ghost image removable delay time is 44.7 μs as described above, the corresponding range of preghost image was set at −2 μs in the example shown in FIG. 2. That is, tap coefficients of the transversal filter 11 are from C-29, through CO to C34.

The circuit is of such a construction that output of the transversal filter 11 and the transversal filter 12 are substracted in the subtractor 9 to remove ghost image components. The delay unit 21 operates at the delay time 34T. So that output of the transversal filters 11 and 12 are delayed by T on time base.

It is, however, considered that with the advancement of integration of digital IC, the number of taps that can be integrated in a single chip will further increase in the future. If so, the number of taps of the transversal filter 11 will be increased.

In this case, therefore, it becomes also necessary to extend the delay time (the number of delay taps) of the delay unit 21 corresponding to the increase in the number of taps in order to delay the time base of outputs of the transversal filters 11 and 12 by T. This will increase the size of the circuit and its cost.

Thus, in the conventional transversal equalizer described above (i.e., such as transversal filter 11) there was the problem that it becomes necessary to increase the delay time of the delay unit (i.e., such as delay unit 21) and the circuit size of the delay unit becomes large, with a corresponding increase in the number of taps in a single chip.

SUMMARY OF THE INVENTION

It is, therefore, an object of the present invention to provide a transversal equalizer which is able to reduce the circuit size without requiring a delay unit even when the series connection of recursive and non-recursive transversal equalizers is adopted.

In order to achieve the above object, a transversal equalizer having a specified number of rear taps according to one aspect of the present invention includes a first transversal equalizer unit which receives input signals through a first input terminal, equalizes their waveforms, and outputs the equalized signals as cascaded signals and a second transversal equalizer unit which receives the cascade output signals and also receives input signals and outputs an equalized signal derived from the input signals.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
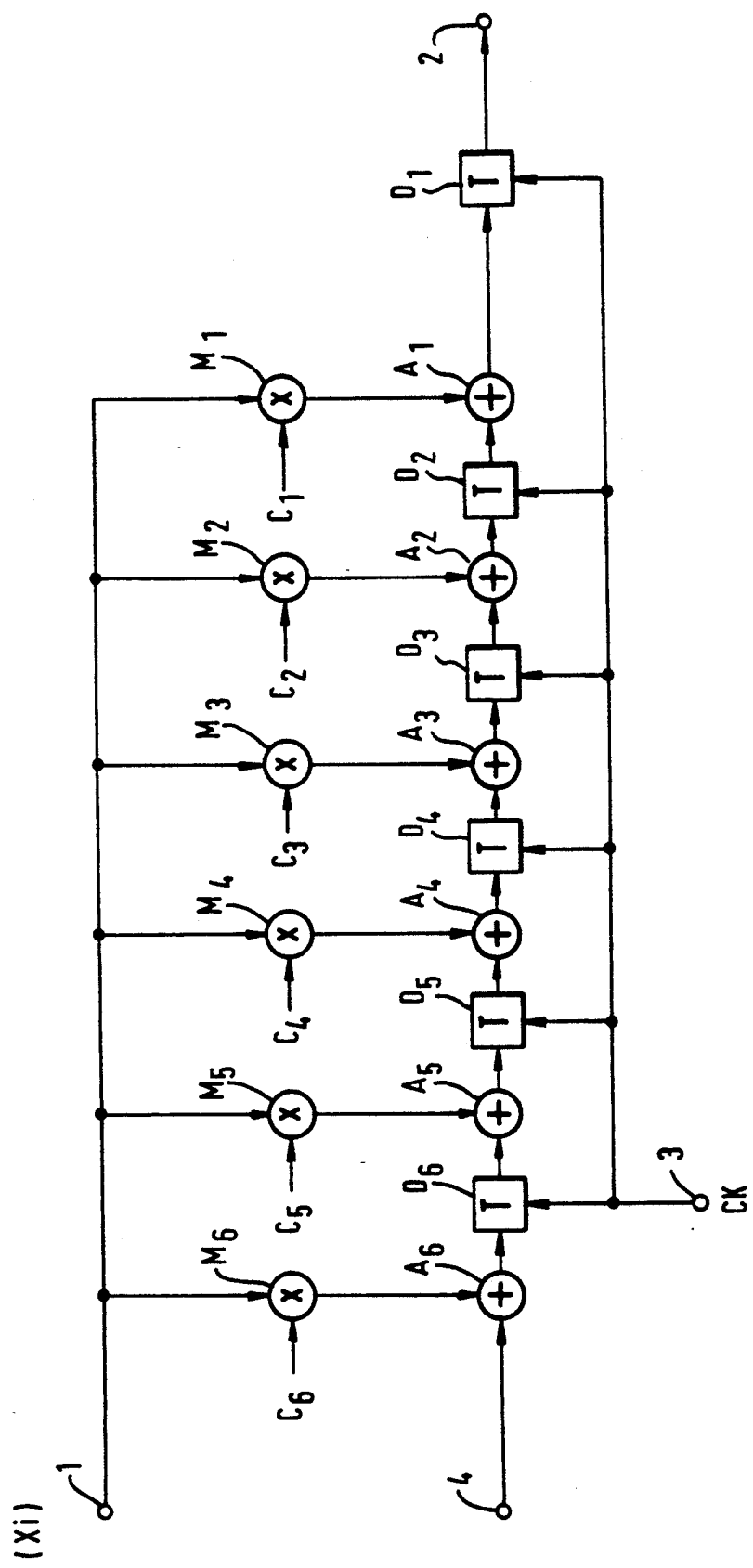
FIG. 1 is a circuit diagram showing a conventional transversal filter.
Figure 2:
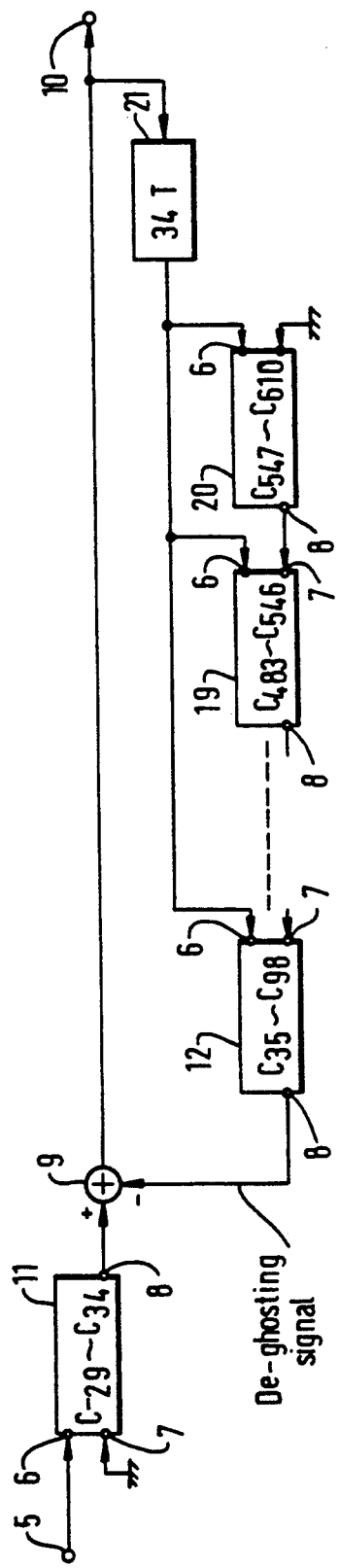
FIG. 2 is a circuit diagram showing a conventional deghosting apparatus using the transversal filter of FIG. 1.

The present invention will be described in detail with reference to the FIGS. 3 through 7. Throughout the drawings, reference numerals or letters used in FIGS. 1 and 2 will be used to designate like or equivalent elements for simplicity of explanation.

Figure 3:
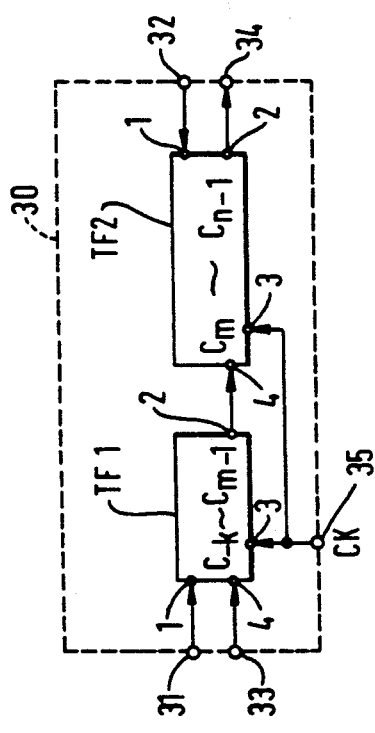
FIG. 3 is a circuit diagram showing a first embodiment of the transversal equalizer according to the present invention.

Referring now to FIG. 3, a first embodiment of the transversal equalizer according to the present invention will be described in detail. FIG. 3 is a circuit diagram showing the first embodiment of the transversal equalizer.

A transversal equalizer 30, enclosed in a broken line, is composed of the transversal filters TF1 and TF2 connected in series. The transversal filters TF1 and TF2 are the same construction as the transversal equalizer shown in FIG. 1. The transversal filter TF1 has k+m coefficient multipliers, i.e., k+m taps (not shown). The coefficients C−k through Cm−1 are applied to these taps, respectively. The transversal filter TF2 has n−m coefficient multipliers, i.e., n−m taps (not shown). The coefficients Cm through Cn−1 are applied to these taps, respectively.

On the transversal filters TF1 and TF2, the cascade output of the preceding stage is output to the cascade input terminal 4. An input signal is input to the input terminal 1. A waveform equalization is performed through multiplication based on tap coefficient by the coefficient multiplier and delay processing based on clock CK which is input to the terminal 3. Then signals are output from the output terminal 2 after waveforms are equalized.

The input terminals 31 and 32 of the transversal equalizer 30 are connected to the input terminal 1 of the transversal filters TF1 and TF2, respectively. The cascade input terminal 33 is connected to the cascade input terminal 4 of the transversal filter TF1 and provides the cascade output of the transversal equalizer at a preceding stage (not shown) to the transversal filter TF1. The cascade output from the output terminal 2 of the transversal filter TF1 is applied to the cascade input terminal 4 of the transversal filter TF2. The output terminal 34 is connected to the output terminal 2 of the transversal filter TF2 and leads out the cascade output. Clock CK supplied to the clock input terminal 35 of the transversal equalizer 30 is applied to the delay unit (not shown) through the input terminal 3 of the transversal filters TF1 and TF2.

Further, when 214 is set as the total number of taps (k+n) of the transversal equalizer 30, values of 29, 35 and 185 are considered for k, m and n, respectively, when conventional equalizing performance is considered. That is, the number of fore taps of the transversal filter TF1 is 29 and the number of rear taps is 34. These figures are equivalent of those of the transversal filter TF1. In this case, equalization times of the transversal filter TF1 ranges from $-kT$ to $(m-1)T$ (T is the clock period) and if T is 69.84 ns, they range from $-2$ to 2.4 µs. Further, the transversal filter TF2 has a range of equalization times from $mT$ $(n-1)T$ (35T through 184T).

In an embodiment of the transversal equalizer in such construction as described above, when non-cyclic and cyclic type filters are connected in series, it is necessary to connect a delay unit (not shown) which generates some delay time $(m-1)T$ of the transversal filter TF1 between the output terminal 34 and the input terminal 32. The cascade output from the transversal filter TF2 is input to the input terminal 1 of the transversal filter TF2 through the input terminal 32 after being delayed by $(m-1)T$. On the other hand, the cascade output from the output terminal 2 of the transversal filter TF1 is input to the cascade input terminal 4 of the transversal filter TF2. That is, the operation corresponding to the last tap of the transversal filter TF1 and that corresponding to the first tap of the transversal filter TF2 are continuously carried out on the time base. Furthermore, it does not depend on the number of taps of the transversal filter TF2.

For instance, if the maximum delay time is set at the same delay time as before by the transversal filter TF1, it is possible to use a delay unit which operates at the same delay amount as before irrespective of the number of taps of the transversal filter TF2. Thus, it has been made possible to perform waveform equalization and removal of ghost images through series connection of non-cyclic and cyclic type filters without increasing the number of stages of the delay units.

Figure 4:
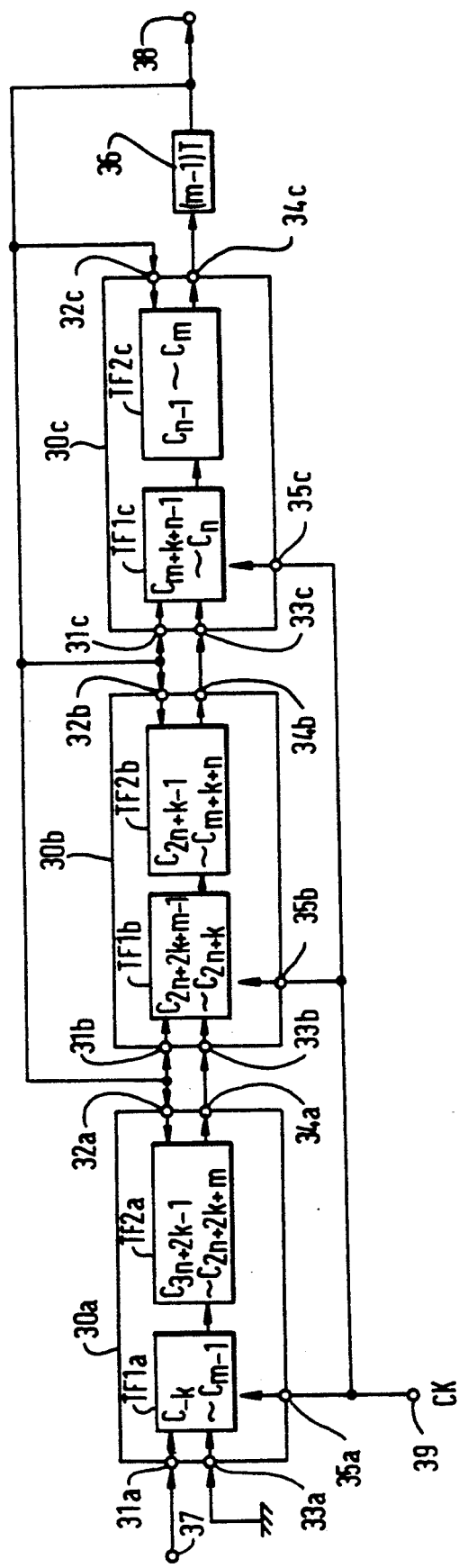
FIG. 4 is a circuit diagram showing a deghosting apparatus adopted the transversal equalizer of FIG. 3.

Shown in FIG. 4 is a circuit diagram showing an embodiment of the transversal equalizer according to the present invention applied to a deghosting apparatus. In this embodiment, transversal equalizer ICs 30a, 30b and 30c are the same construction as the transversal equalizer 30 shown in FIG. 3, and are used by connecting them in series.

A video signal containing ghost components is input to the input terminal 37. This video signal is input to the input terminal 31a of the transversal equalizer IC 30a.

The cascade input terminal 33a of the transversal equalizer IC 30a in the initial stage is connected to the reference potential point and the cascade output from the output terminal 34a is applied to the cascade input terminal 33b of the transversal equalizer IC 30b in the next stage. The cascade output from the transversal equalizer IC 30b is applied to the cascade input terminal 33c of the transversal equalizer IC 30c in the last stage through the output terminal 34b. The cascade output from the output terminal 34c of the transversal equalizer IC 30c is applied to the 36, which operates at $(m-1)T$ delay time and outputs a delayed output signal to the output terminal 38 and at the same time, to the input terminals 32a, 31b, 31c and 32c of the transversal equalizers 30a, 30b and 30c. Thus, the transversal filter TF1a is a non-cyclic type construction and the transversal filters TF2c, TF1c, TF2b, TF1b and TF2a are cyclic construction.

Video signal received through the input terminal 31a is applied to the coefficient multipliers of the transversal filter TF1a. To all the taps of the transversal filter TF1a, tap coefficients $C-k$ through $Cm-1$ are applied, respectively and the transversal filter TF1a performs waveform equalization based on the tap coefficients and gives the cascade output to the transversal filter TF2a. Waveform equalization in the time range of $-kT$ through $(m-1)T$ is possible by the transversal filter TF1a and therefore, as described above, the delay unit 36 which operates at $(m-1)T$ delay time is adopted. Further, clock CK of the clock input terminal 39. This clock CK is applied to the delay units (not shown) through the clock input terminals 35a, 35b and 35c.

In order to continuously carry out the operation corresponding to the last tap of the transversal filter TF1a and that corresponding to the first taps of other transversal filters TF2a, TF1b, TF2b, TF1c and TF2c on the time base, the delay amount by the delay units in the cyclic loop has been set at $(m-1)T$. That is, a delay time within the mT loop is given by the last tap of the transversal filter TF2c, which gives a signal to the delay unit 36. The more taps located closer to the front stage side from this tap, the more the delay amount in the cyclic loop increases, and the tap coefficient $C3n+2k-1$ (C612) to remove ghost image of the longest delay time is applied to the tap of the transversal filter TF2a to which the cascade output of the transversal filter TF1a is applied.

That is, tap coefficients $C3n+2k-1$ through $Cm+2n+2k$ are applied to the taps of the transversal filter TF2a, tap coefficients $Cm+2n+2k-1$ through $C2n+k$ to the taps of the transversal filter TF1b, tap coefficients $C2n+k-1$ through $Cn+m+k$ to the taps of the transversal filter TF2b, coefficients $Cn+m+k-1$ through $Cn$ to the taps of the transversal filter TF1c, and tap coefficients $Cn-1$ through $Cm$ to the taps of the transversal filter TF2c. The transversal filters TF1a, TF2a, TF1b, TF2b, TF1c and TF2c perform waveform equalization based on these tap coefficients.

In the embodiment of the transversal equalizer as described above, if k, m and n are assumed to be, for instance, 29, 35 and 185, respectively, the number of front taps of the transversal filter TF1 will be 29, the number of rear taps will be 34 and the total number of taps of the transversal equalizer ICs 30a, 30b and 30c will become 642. That is, if the T is 69.84 ns, the non-cyclic type transversal filter TF1a will remove $-2$ through 2.4 μs pre-ghost and nearby-ghost images and the cyclic type transversal filters TF2c, TF1c, TF2b, TF1b and TF2a will remove 2.4 through 42.7 μs long delayed ghost images.

As described above, in this embodiment the transversal filter TF1a is non-cyclic type construction and the transversal filters TF2a, TF1b, TF2b, TF1c and TF2c are cyclic type construction by giving the cascade outputs of the transversal equalizers to the transversal equalizers in the next stage and also, by giving the output from the transversal filter TF2c in the last stage to the transversal filters TF2a, TF1b, TF2b, TF1c and TF2c in the second stage and thereafter by delaying it by an amount based on the transversal filter TF1a. Thus, it is possible to compose a transversal equalizer, such as shown in FIG. 4., with delay units like delay unit 36, of a specific number of stages and prevent an increase of circuit scale of the delay unit irrespective of the number of taps of the transversal equalizers after the second stage.

Further, the case where the number of taps of an equalizing IC is limited as described above. It is however apparent that if an equalizing IC having 320 taps is used, it is sufficient to use the transversal equalizer ICs 30a and 30c only and omit the transversal equalizer IC 30b.

Figure 5:
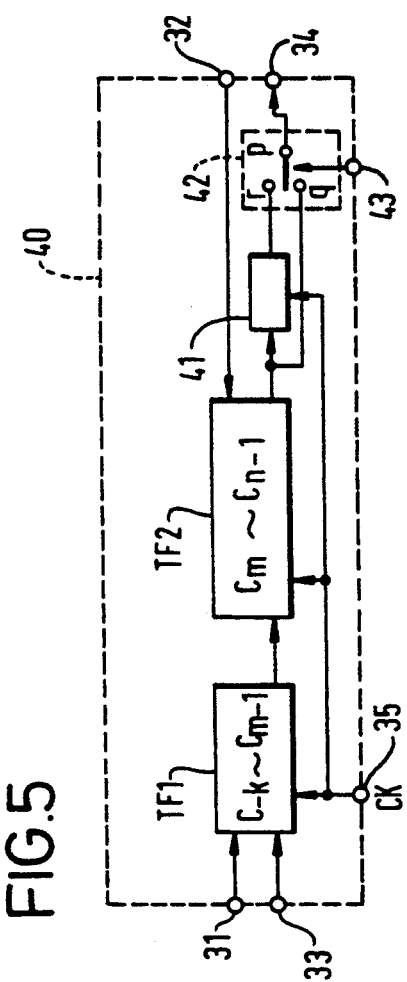
FIG. 5 is a circuit diagram showing a second embodiment of the transversal equalizer according to the present invention.

Shown in FIG. 5 is a circuit diagram showing another embodiment of the present invention. In FIG. 5 the same components as those shown in FIG. 3 are assigned with the same symbols and the explanations are omitted.

The transversal equalizer 40 in this embodiment differs from that shown in FIG. 3 in that a delay unit 41 and a switch 42 have been added. That is, the cascade output of the transversal filter TF2 is applied to the delay unit 41 and the terminal q of the switch 42. The delay unit 41 operates at a delay amount of (m−1)T and outputs the delay output to the terminal r of the switch 42. The terminal p of the switch 42 is connected to the output terminal 34 of the transversal equalizer 40. The switch 42 selects the terminal r according to the high level control signal (thereafter referred to as "H") which is input from a control terminal 43 of the transversal equalizer 40 and selects the terminal q according to the low level control signal (thereafter referred to as "L").

In the embodiment of the transversal equalizer composed in such construction as described above, the switch 42 is changed over by a control signal which is input to the control terminal 43. Now, if "H" control signal is applied to the control terminal 43, the switch 42 selects the terminal r. Then, the cascade output of the transversal filter TF2 is delayed by (m−1)T by the delay unit 41 and is output to the output terminal 34 through the input terminal 32. When the output terminal 34 is connected with the input terminal 32, it becomes possible to compose the transversal filter TF2 in cyclic type construction without connecting a delay unit externally.

On the other hand, if "L" control signal is applied to the control terminal 43, the switch 42 selects the terminal q. Then, the cascade output of the transversal filter TF2 is directly output to the output terminal 34 through the input terminal 32. In this case, it is possible to give the cascade output to a transversal equalizer in the next stage.

Figure 6:
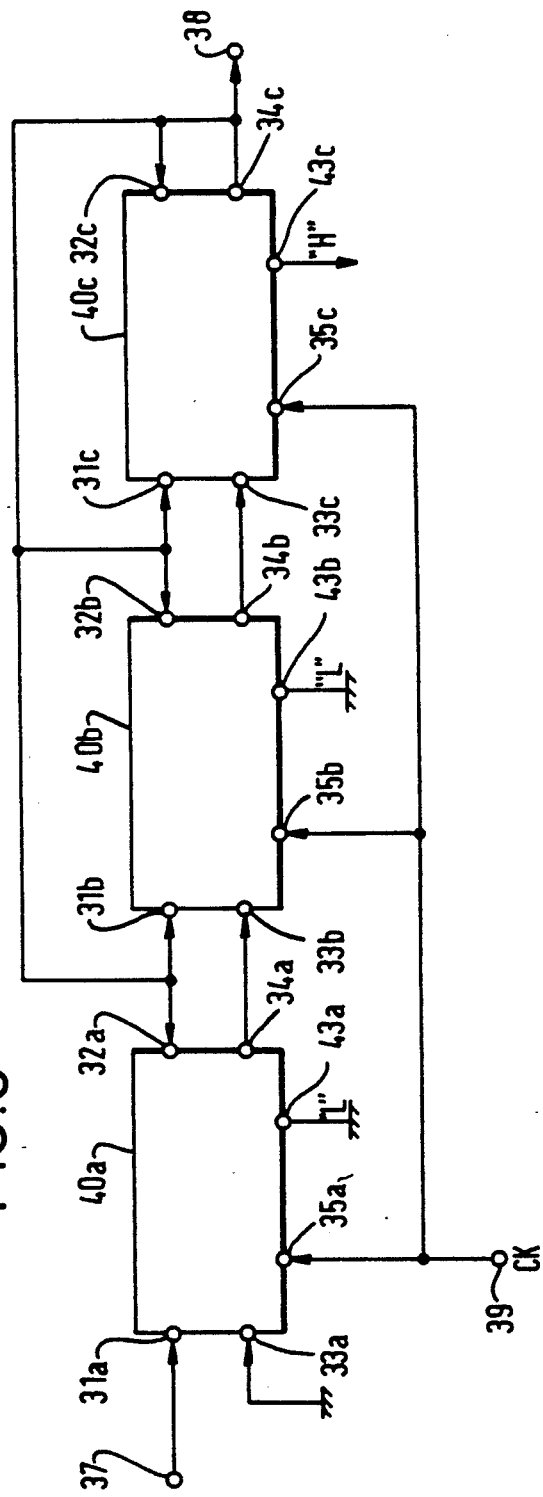
FIG. 6 is a circuit diagram showing a deghosting apparatus adopted the transversal equalizer of FIG. 5.

Shown in FIG. 6 is a circuit diagram showing an embodiment of a deghosting apparatus which is composed by connecting this transversal equalizer 40 in series. In FIG. 6 the same components as those shown in FIG. 4 are assigned with the same symbols and the explanations are omitted.

The transversal equalizer ICs 40a, 40b and 40c in the same construction as the transversal equalizer shown in FIG. 5. In this embodiment the delay unit 36 shown in FIG. 4 has been omitted and the cascade output from the output terminal 34c of the transversal equalizer IC 40c is output to the output terminal 38 and also, to the input terminals 32a, 31b, 32b, 31c and 32c of the transversal equalizer ICs 40a, 40b and 40c.

The control terminals 43a and 43b of the transversal equalizer ICs 40a and 40b are connected to the reference potential point and "H" control signal is applied to the control terminal 43c of the transversal equalizer IC 40c.

In the embodiment of the transversal equalizer as described above, the switch 42 of the transversal equalizer ICs 40a and 40b selects the terminal q and the cascade output of the transversal equalizer ICs 40a and 40b is directly applied to the transversal equalizer ICs 40b and 40c in the next stage. Further, since the switch 42 of the transversal equalizer IC 40c selects the terminal r, the cascade output of the transversal equalizer IC 40c is delayed by (m−1)T and applied to each input terminal. That is, the circuit shown in FIG. 6 will become the same circuit construction as shown in FIG. 4. Other operations are the same as those of the embodiment shown in FIG. 4.

Since the transversal equalizer 40 having the delay unit 41 internally is used in this embodiment, it is not necessary to provide a delay unit externally and it has an advantage that it becomes easy to mount the transversal equalizer on a circuit board.

Figure 7:
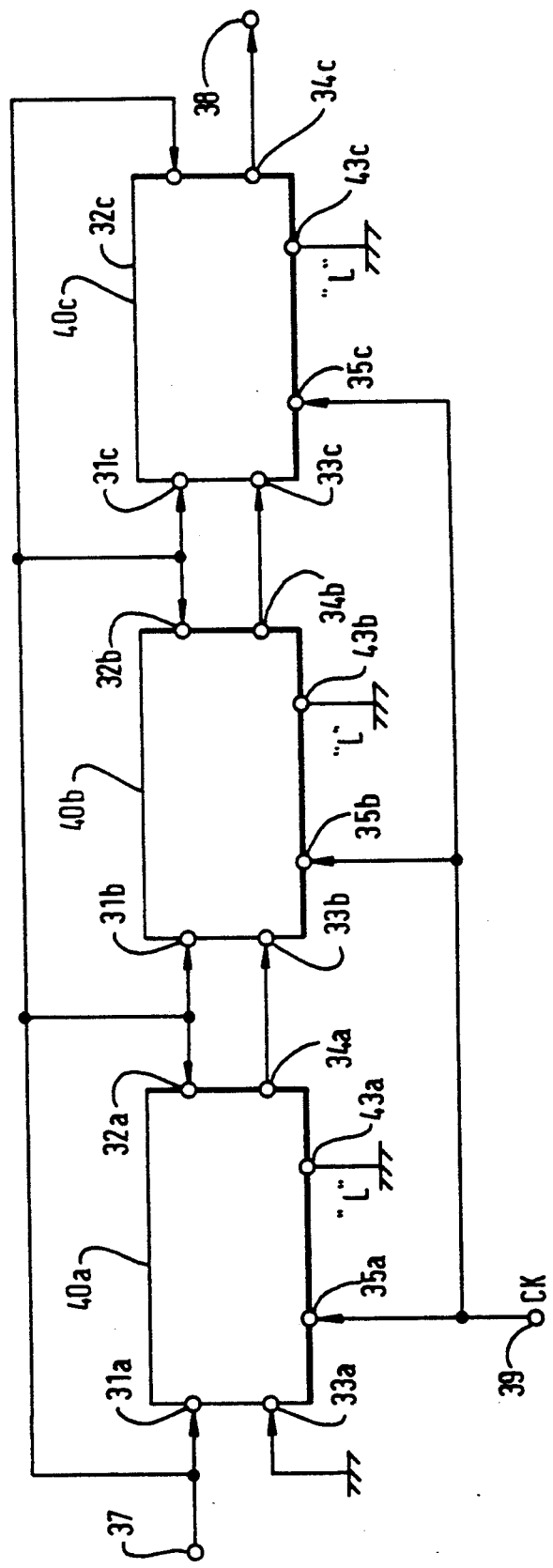
FIG. 7 is a circuit diagram showing a third embodiment of the transversal equalizer according to the present invention.

Shown in FIG. 7 is a circuit diagram showing another embodiment of the present invention. In FIG. 7 the same components as those shown in FIG. 6 are assigned with the same symbols and the explanations are omitted.

This embodiment differs from the embodiment shown in FIG. 6 in that signal input to the input terminal 37 is applied to the input terminals 31a and 32a of the transversal equalizer IC 40a, the input terminals 31b and 32b of the transversal equalizer IC 40b and the input terminals 31c and 32c of the transversal equalizer IC 40c, the cascade output of the transversal equalizer IC 40c is output only to the output terminal 38 without feeding it back, and the control terminals 43a through 43c are connected to the reference potential point to have the switch 42 select the terminal q.

In the embodiment as described above, the cascade outputs of the transversal equalizer ICs 40a, 40b and 40c are applied to the transversal equalizer ICs and the output terminal 38 in the next stage and the transversal equalizer ICs 40a, 40b and 40c are connected in non-cyclic type construction. It is thus possible to avoid an unstable phenomenon that oscillation may be generated on a transversal equalizer in cyclic type construction.

Further, the present invention is not limited to the embodiments described above but it is apparent that the cyclic type construction is possible by connecting the transversal equalizer 30 shown in FIG. 3 in series with the same wiring as the external wiring shown in FIG. 7 and omitting the delay unit 36. Further, delay amount of the delay units 36 and 41 may be permitted at (m−1)T or less. That is, in this case the operations are carried out repeatedly on the time axis at part of the taps of the cyclic and non-cyclic type transversal equalizers but it is possible to remove ghost images certainly by stopping use of other taps.

As described above, the present invention can provide an extremely preferable transversal equalizer.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. A transversal equalizer comprising:
   a first transversal equalizer unit which has a specified number of rear taps and receives first input signals through a first input terminal and outputs these signals as cascaded signals after equalizing their waveforms;
   a second transversal equalizer unit which receives the output signals from the first transversal equalizer unit and also receives second input signals through a second input terminal, and outputs an equalized signal derived from the second input signals;
   delay means which receives output signals from the second transversal equalizer unit and delays them based on the specified number of rear taps; and
   selecting means which selectively outputs the output from either the second transversal equalizer unit or the delay means via an output terminal.

2. A transversal equalizer as claimed in claim 1, wherein when the output from the delay means is selected by the selecting means, the output terminal is connected to the second input terminal.

3. A transversal equalizer comprising:
   a first and second input terminal;
   an output terminal;
   a first transversal equalizer unit having a specified number of rear taps and receiving first input signals via said first input terminal, said first transversal equalizer unit generating first equalized signals by equalizing waveforms of said input signals and outputting said first equalized signals as cascaded signals;
   a second transversal equalizer unit receiving second input signals via said second input terminal and receiving said cascaded signals, said second transversal equalizer unit outputting second equalized signals derived from said second input signals; and
   delay means for delaying said second equalized signals based on said specified number of rear taps and outputting the delayed signals via said output terminal.

* * * * *